United States Patent [19]

Urata

[11] Patent Number: 4,956,684
[45] Date of Patent: Sep. 11, 1990

[54] PRINTER HEAD WITH LIGHT EMITTING ELEMENT ARRAY

[75] Inventor: Manabu Urata, Tokyo, Japan

[73] Assignees: Fuji Xerox Co., Ltd., Tokyo; Sanyo Electrical Co., Ltd., Osaka, both of Japan

[21] Appl. No.: 246,598

[22] Filed: Sep. 20, 1988

[30] Foreign Application Priority Data

Sep. 24, 1987 [JP] Japan .................. 62-239674

[51] Int. Cl.⁵ ............................. H01L 33/00
[52] U.S. Cl. ................. 357/17; 346/107 R; 346/160; 355/229
[58] Field of Search ............ 346/107 R, 160; 357/17; 355/229

[56] References Cited

U.S. PATENT DOCUMENTS 4,331,737  5/1982  Nishizawa et al. .............. 357/52
4,721,977  1/1988  Fukae .......................... 357/17

FOREIGN PATENT DOCUMENTS 58-112376   7/1983  Japan .
58-159763  10/1983  Japan .
59-138253   9/1984  Japan .
59-194566  11/1984  Japan .
60-70782    4/1985  Japan .
6083463     5/1985  Japan ......................... 305/229
61-61479    3/1986  Japan .

Primary Examiner—Jerome Jackson, Jr.
Attorney, Agent, or Firm—Finnegan, Henderson, Farabow, Garrett, and Dunner

[57] ABSTRACT

A printer head has an LED element array which is composed of a plurality of LED chips having a predetermined number of LED elements. In order to reduce the contrast of image forming light profile, end portions of a light emitting portion of the LED element are coated with an SiN film.

5 Claims, 4 Drawing Sheets

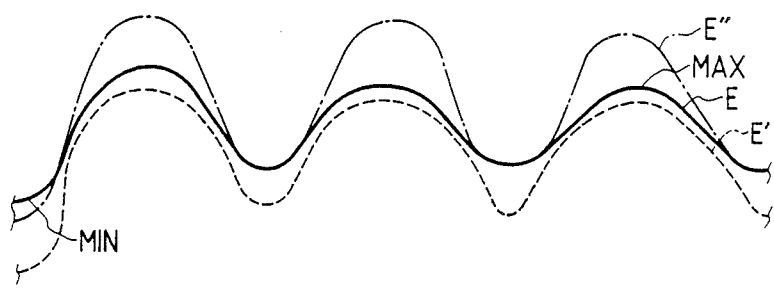
FIG. 3
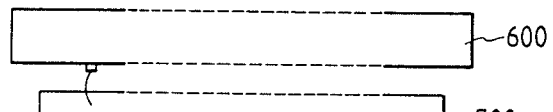
FIG. 4(a)
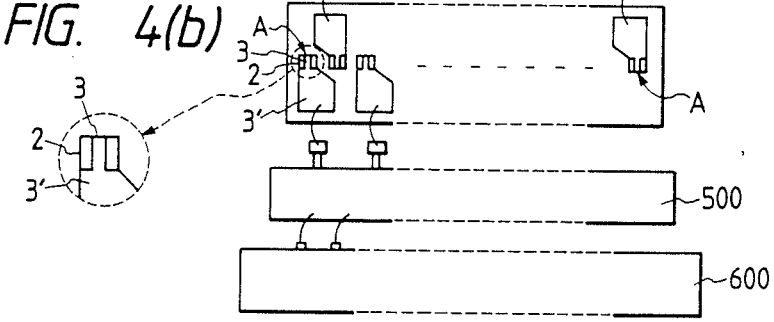
FIG. 4(b)
FIG. 5
PRIOR ART
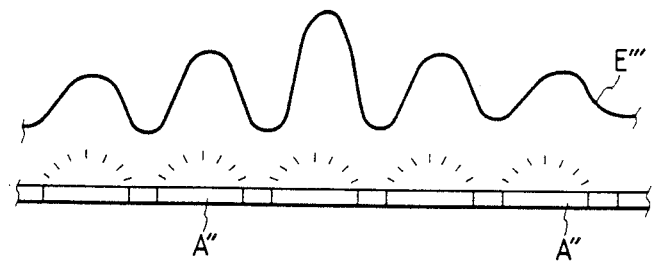

PRINTER HEAD WITH LIGHT EMITTING ELEMENT ARRAY

BACKGROUND OF THE INVENTION

The present invention generally relates to a printer head which employs a light emitting element array, and more particularly, to a printer head capable of obtaining printer output having high picture quality by diminishing contrast of an image forming light profile.

An image recording device such as a photo printer, an electronic-photo-type copying machine, or the like typically forms an image by repeating processes such as electrification, exposure, development, transfer, cleaning and elimination of electricity with respect to a photosensitive drum. There is now exemplified a printer head which utilizes light emitting diodes (hereinafter referred to as LED) for providing a light signal to control the exposure of the photosensitive drum in accordance with a picture signal.

The LED printer head, as illustrated in FIG. 4(a), includes a plurality of LED elements A which are arranged in an array. Each LED element A has, as illustrated in an enlarged view of FIG. 4(b), a light emitting portion 2 and an electrode 3. The electrode 3 is connected through a bonding pad 3' to one of driver ICs 500 formed on both sides of the LED elements A.

Each driver IC 500 is connected to a control member 600. The driver IC 500 is controlled by the control member 600 according to an image signal inputted to the control member 600 from outside, thereby transmitting a driving signal to the corresponding LED elements. The LED elements thus driven emit light, and the emitted light beams travel through a converging rod lens array (not shown) consisting of SELFOC lenses, or the like disposed above the LED elements and are formed into an exposure image on the photosensitive drum, thus forming a latent image.

There arises, however, such a problem inherent in the printer head using the LED elements that variation in an exposure amount of the photosensitive body is caused by dispersion in LED characteristics or unevenness in an optical system. More specifically, if there is dispersion in the characteristics of LED elements A'', as illustrated in FIG. 5, the variation is produced in an image forming light profile E''' which is obtained by converging the emitted light beams through the optical system. As a result, density of a produced picture does not become uniform and also picture quality is deteriorated.

Under such circumstances, there have been made a variety of improvements. For instance, a resistor which can be trimmed is electrically connected to each LED element, and intensities of emitted light beams are controlled by trimming the resistors so as to become uniform (e.g., Japanese Patent Laid-Open Publication No. 112376/1983). Another method is such that the light intensity of a light emitting element or element block is controlled while correcting it with a voltage of a driving signal for the light emitting element, thus stabilizing the light intensity of the light emitting element (e.g., Japanese Patent Laid-Open Publication No. 194566/1984).

Methods of simply increasing the luminance are disclosed in, e.g., Japanese Utility Model Laid-Open No. 159763/1983, Japanese Utility Model Laid-Open No. 138253/1984, Japanese Patent Laid-Open Publication No. 70782/1985, and Japanese Patent Laid-Open Publication No. 61479/1986. There is made, however, no proposal for the purpose of improving the overall light emitting profile when actually incorporating the method into a printer.

The LED elements which constitute the LED printer head are arranged in such a way that, as depicted in FIG. 6(a), the electrode 3 is disposed on the center of the light emitting portion 2, thus forming an LED element A; this LED element A in turn constitutes one dot. In general, 64 dots of the LED elements constitute one chip. The LED chips are dice-bonded at a connecting portion C' so as to form a head having a required length. FIG. 6(b) illustrates the light emitting profile of the LED printer head thus constituted, wherein the light intensity is reduced in the electrode portion 3 and at a boundary B' between the adjacent LED elements, and further at the connecting portion C' between the chips. Especially in the connecting portion C', some deterioration of luminance tends to be caused by cutting damages, resulting in creation of an unfavorable light emitting profile.

An enhancement in light intensity at edge portions of the light emitting portion 2 of the LED element is attributed to the fact that an SiN film employed as a diffusion mask when forming the LED element remains at the edge portions of the light emitting portion 2. Namely, if the light emitting portion 2 of the LED element directly borders on an atmosphere, part of the emitted light is subjected to the total internal reflection at the boundary surface because of the large difference between the refractive indices of the light emitting portion 2 and the atmosphere. Therefore, a transmissivity of the emitted light is decreased. However, by virtue of the presence of the SiN film whose refractive index is approximately in the midst of those of the light emitting portion 2 and the atmosphere, the transmissivity of the edge portion is not decreased so much, thereby resulting in the enhancement in light intensity at that portion.

FIG. 7 shows a profile E' of image forming light which was originally emitted from the LED element array with such a light emitting profile D' as shown in FIG. 6(b) and then transmitted from the converging rod lens array 8 consisting of, e.g., the SELFOC lenses.

In FIG. 7, the reference symbol A' designates the LED element portion; B', the boundary between the adjacent LED elements; and C', the connecting portion between the LED chips. The light intensity is strong at the LED element portion A', whereas it is weak at the boundary B' between the LED elements and at the connecting portion C' between the LED chips, thus forming gorges.

The contrast thereof can be expressed as:

$$\text{Contrast} = \frac{\text{MAX} - \text{MIN}}{\text{MAX} + \text{MIN}}$$

where MAX is the maximum value of the light intensity profile E', and the MIN is the minimum value thereof.

Even if the light intensities of the light emitting portions are made uniform, i.e., if MAXs are made uniform, the contrast of the image forming light profile E' is still large. Therefore, the conventional LED printer head is accompanied with the following defects.

A method of recording the picture image includes a positive developing type background writing method and a negative developing type image writing method. The background writing method is based on the steps of exposing a photosensitive body to the light emitted from the LED elements and eliminating electric charge at the portions excluding a character image to form an electrostatic latent image. The negative developing method is intended to develop the portion written by the light from the LED elements. If the contrast of the image forming light profile is large, there is created such a problem in the former method that black streaks are apt to appear at the portions corresponding to the boundaries (portions B' in FIG. 7) between the LED elements and at the connecting portions (portions C' in FIG. 7) between the LED chips, and the image quality is deteriorated because of bad reproducibility of fine lines.

The reproducibility of fine lines herein implies reproducibility of one-dot lines. In the LED printer based on the background writing method, gorges, viz., portions of MIN are produced in the image forming light profile of the LED printer head at the portions excluding the light emitting portions of the LED elements, especially at the connecting portions between the LED chips. The light of that portion is relatively weak, and hence the electric charge on the photosensitive body can not be fully erased. As a result, a small amount of toner is adhered thereto, and the black streaks are likely to be produced. To eliminate the black streaks, the following method is taken: The light intensity is strengthened by increasing, e.g., the luminance of the LED elements or a lighting duty, thereby erasing the electric charge. As a result, however, one-dot lines tend to become thin, the image reproduction becomes difficult, and the image quality is deteriorated.

This is, as described above, derived from the fact that because of the structural disadvantage of the LED elements it is difficult to form such light having the image forming light profile with the small contrast as is formed in a laser scanning system.

In the image writing method, white streaks are apt to appear on the contrary to the background writing method. To eliminate the white streaks the luminance has to be decreased on the whole. This conduces to a problem in which the one-dot lines become thick and the image quality is degraded.

SUMMARY OF THE INVENTION

It is a primary object of the present invention to provide a structure of an LED printer head for reducing a contrast of the image forming light profile of an LED element array, that is, obtaining a uniform image forming light profile with fewer gorges at the portions excluding light emitting portions of LED elements.

To this end, according to one aspect of the invention, there is provided a printer head with a light emitting element array in which light intensities at both ends of each LED element are strengthened in order to reduce the contrast of the image forming light profile. A light emitting efficiency at both ends of each LED element is increased by selectively coating those portions with an SiN film.

With this constitution of the present invention, the contrast of the image forming light profile is reduced in such a manner that: the luminance of the both ends of each light emitting portion is increased; the profile of the image forming light transmitted from a converging rod lens array becomes close to a rectangular form with maximums being suppressed and bottoms of gorges which are associated with connecting portions between the LED chips, being raised.

The above and other objects and advantages of the invention will become more apparent during the following discussion with reference to the accompanying drawings.

BRIEF DESCRIPTION OF THE DRAWINGS

FIG. 3 illustrates profiles of image forming light transmitted from a converging rod lens array;

FIGS. 4A and 4B are schematic diagram depicting a structure of an LED printer head;

FIG. 5 illustrates an image forming light profile of a conventional LED chip;

DETAILED DESCRIPTION OF THE PREFERRED EMBODIMENT

One embodiment of the present invention will be described hereinafter with reference to FIGS. 1 to 3.

Figure 1A:
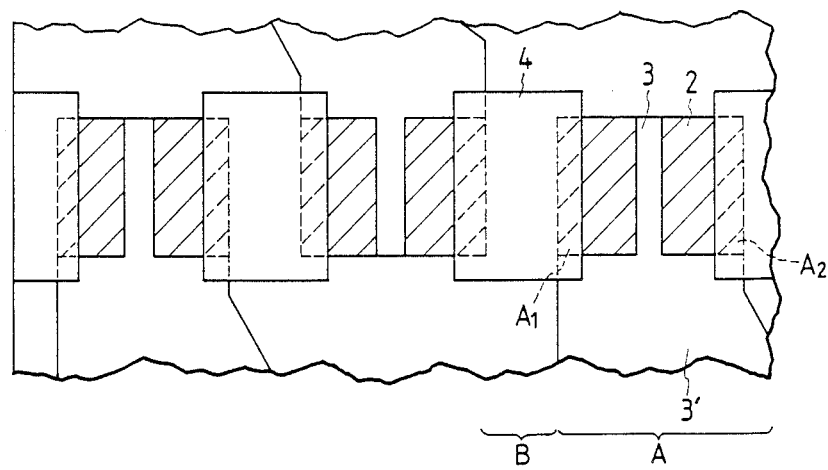
FIGS. 1(a) and 1(b) show a plan view and a sectional view, respectively, of an LED chip according to an embodiment of the present invention.
Figure 1B:
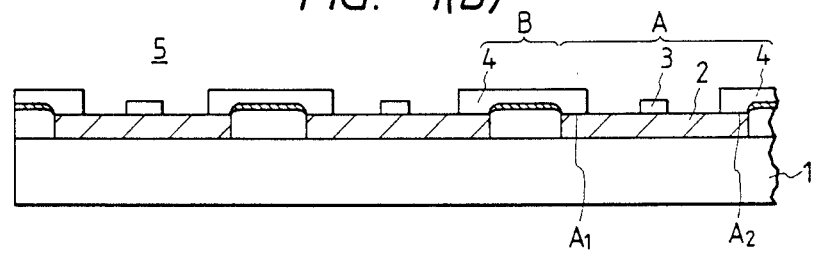

FIG. 1(a) is a plan view of an LED chip in this embodiment. FIG. 1(b) is a sectional view thereof.

In an LED chip shown in FIG. 1, an electrode 3 with width of $10\pm1$ $\mu$m is disposed on the center of a light emitting portion 2 with size of $63\pm5$ $\mu$m$\times 50\pm5$ $\mu$m which is formed on a GaAsP substrate 1. Two end portions $A_1$ and $A_2$ with width of, e.g., 10 $\mu$m of the light emitting portion 2 are covered with SiN films 4. In this embodiment, the SiN film 4 having width of, e.g., 41.5 $\mu$m is provided to cover the adjacent LED elements A. Since only the both ends of the light emitting portion 2 are covered with the SiN film 4, an emitted light transmissivity of these portions, viz., an amount of light passing through the surface of the light emitting portion 2 and entering the atmosphere, becomes large, thereby a light emitting efficiency of these portions increases. As indicated by D of FIG. 2, a luminance only at the both ends of the light emitting portion 2 in this light emitting profile is greater by approximately 20% than that in the conventional light emitting profile (D' of FIG. 2). At the same time, gorges in the profile corresponding to boundaries B between the adjacent LED elements are raised ($B_0$ of FIG. 2).

A mechanism of the above luminance enhancement is explained as follows. Without the SiN coating, because of the large difference between the refractive index of the air ($n_A=1$) and that of the light emitting portion 2 ($n_E=3$) considerable part of the emitted light is subjected to the total internal reflection, resulting in a smaller transmissivity of light. On the other hand, because of the coating of the SiN film 4 with the middle value of refractive index ($n_S=1.8$) the difference in refractive index between the adjacent regions (that is, light emitting portion/SiN film and SiN film/air) is reduced, resulting in the enhancement of light emitting efficiency of, in this case, about 20% at the end portions covered with the SiN film 4.

Figure 2:
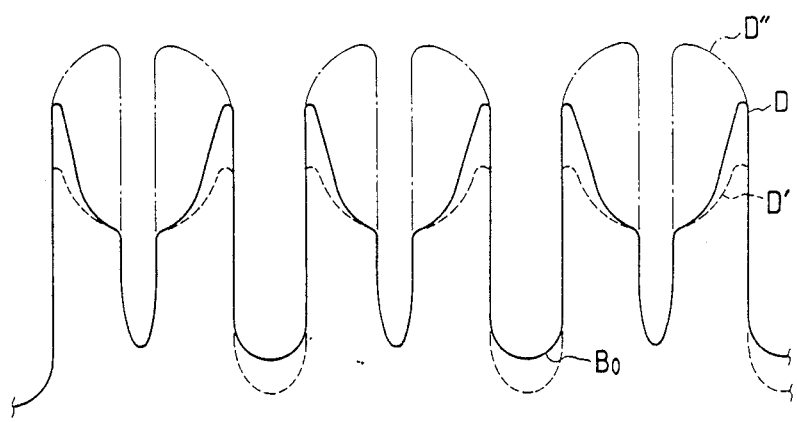
FIG. 2 illustrates profiles of light emitted from the LED chip.
Figure 6A:
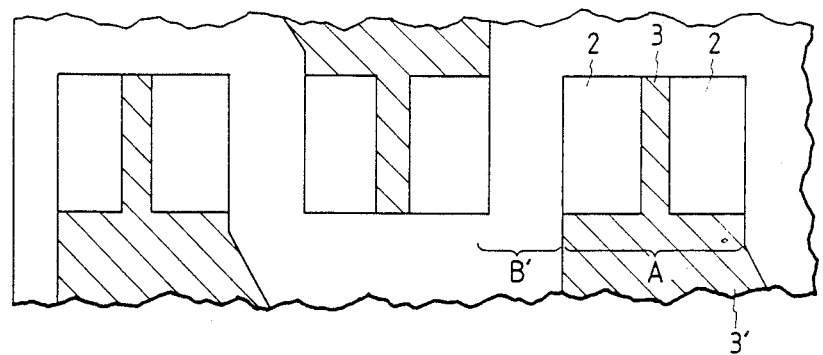
FIG. 6(a) shows a plan view of the conventional LED chip.
Figure 6B:
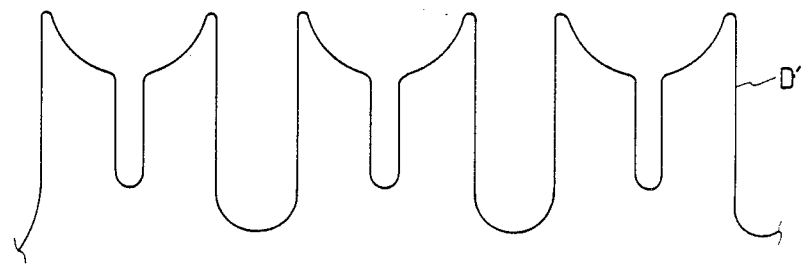
FIG. 6(b) illustrates a profile of light emitted from the conventional LED chip.
Figure 7:
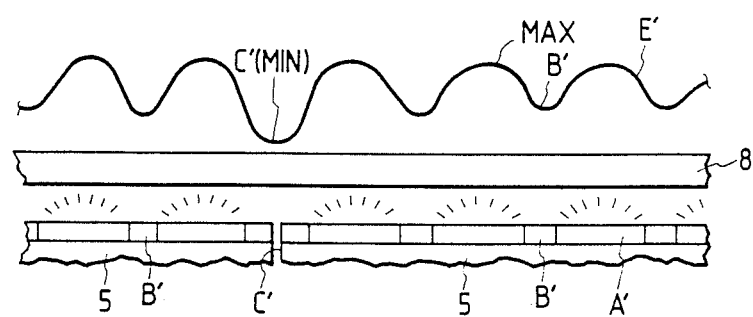
FIG. 7 illustrates an image forming light profile of the conventional LED chip.

The light emitted by the LED elements having a profile depicted in FIG. 2 penetrates a converging rod lens array to form an image. A resultant image forming light profile is shown by a curve E of FIG. 3.

In FIG. 3, the reference symbol E' represents a conventional image forming light profile without the coating of SiN, while the symbol E" designates a conventional image forming light profile in which the luminance of the overall LED dot is increased by SiN-coating the entire surface of the light emitting portion 2 of each LED element. As is apparent from FIG. 3, in the image forming light profile E according to the present invention, while the luminance at the MAX position which appears in the light emitting portion of the LED element is greater by 5% than that in the conventional large contrast image forming light profile E' in which no SiN-coating is made, the luminance at the gorge (MIN position) is increased by approximately 10%. Therefore, the contrast thereof is made small. On the other hand, in the conventional image forming light profile E" wherein the overall surface of the light emitting portion 2 is coated with the SiN film, the luminance at the MAX position is increased by, e.g., about 20%, while the gorge (MIN position) does not exhibit so much increment. Hence, the contrast of the profile is not improved. This is attributed to the fact that the overall SiN-coating of light emitting portion 2 causes such light emitting profile as indicated by D" in FIG. 2 in which the luminance takes a maximum value at a position in the vicinity of the electrode 3 disposed on the center of the light emitting portion 2.

A method of manufacturing the above-described LED printer head will be explained. The process starts with preparation of an N-type GaAsP wafer. The light emitting portion 2 is formed by selectively diffusing zinc. Subsequently, the electrode 3 is formed by, e.g., depositing aluminum and patterning it (obtaining ohmic contact). The SiN film 4 is provided by employing the well-known CVD method and the photolithographic method. The pattern processing is performed so that the end portions with, e.g., 10 $\mu$m width of the light emitting portions 2 are coated with the SiN films 4. The SiN film, whose thickness is 0.1 to 1.0 $\mu$m, may take an amorphous state or a form of a compound such as $Si_3N_4$.

Such a wafer is split into blocks each having, e.g., 64 pieces of light emitting portions 2 by a scribing method or a dicing method, thus obtaining LED chips. Subsequently, a required number of LED chips are dice-bonded in a row, thereby obtaining an LED printer head.

In this embodiment, there has been exemplified the case where the end portions of every LED element are selectively coated with the SiN film. The present invention is not confined to this arrangement. Namely, it is feasible to raise the intensity of emitted light only at the connecting portion between the LED chips. A distance between the light emitting portions of the adjacent LED elements is relatively long at the connecting portion as compared with that between the LED elements within the same chip. Consequently, the black streaks tend to appear at that portion especially in the background writing method. To cope with this, the SiN-coating is made only on the end portions of the LED elements adjacent to the connecting portion of the LED chips so as to increase the intensity of emitted light at this connecting portion. With this arrangement, the contrast of the image forming light profile can be reduced without increasing the luminance of the entire LED printer head, so that the black streaks can be prevented without causing thinner lines.

In the above description of the manufacturing method, the LED element is formed by diffusing Zn into the GaAsP wafer. The present invention is not, however, limited to this formation. The formation of the LED element may involve, for instance, such a step that a GaAsP layer is vapor-phase-grown on a GaAs substrate.

The foregoing embodiment has dealt with the case where the SiN film (see the numeral 4 of FIG. 1) is formed on the surface including the boundary portion B between the LED elements. However, the SiN film is not indispensable for the boundary B. The SiN-coating on this boundary portion may be omitted.

Moreover, the coating film of the invention is not limited to the SiN film. Instead, the coating film may be made of $Al_2O_3$, $SiO_2$, SiON, or epoxy resin.

By virtue of the constitution of the present invention, the contrast in the image forming light profile of the LED printer head can be diminished, and it is further possible to obviate such a defect that the black streaks are apt to be created in the image corresponding to the connecting portion between the LED chips in the background writing method. In the prior art, the luminance of the entire LED element is increased with a view to eliminating the black streaks. In sharp contrast with this, however, the present invention does not require such a process, resulting in obviation of the defect that the lines of image become thin. Moreover, the reproducibility of fine lines can be enhanced, thereby obtaining an image with high quality.

The defect that the white streaks tend to appear can be eliminated also in the image writing method, and the reproducibility of fine lines is likewise improved, thereby acquiring the high quality image.

Although the illustrative embodiment of the present invention has been described in greater detail with reference to the accompanying drawings, it is to be understood that the invention is not limited to the precise embodiment. Various changes or modifications may be effected therein by one skilled in the art without departing from the scope or spirit of the invention.

What is claimed is:

1. A printer head having an array of light emitting elements, comprising:
    a plurality of light emitting portions formed on a substrate;
    electrode portions disposed on said respective light emitting portions; and
    transparent film disposed only on edge portions of said respective light emitting portions in an aligning direction of the array.

2. A printer head having an array of light emitting elements as claimed in claim 1, wherein said array of light emitting elements comprises a plurality of chips, each of said chips having a predetermined number of said light emitting elements, whereby selected ones of said edge portions of said light emitting portions are covered with said transparent film.

3. A printer head having an array of light emitting elements as claimed in claim 1, wherein said transparent film is made of SiN.

4. A printer head having an array of light emitting elements as claimed in claim 1, wherein said light emitting element is a light emitting diode.

5. A printer head having an array of light emitting elements as claimed in claim 1, wherein each of said electrode portions is disposed on each of said light emitting portions so as to cover a center area thereof, said center area extending perpendicularly to said aligning direction.

* * * * *

UNITED STATES PATENT AND TRADEMARK OFFICE
CERTIFICATE OF CORRECTION

PATENT NO. : 4,956,684
DATED      : September 11, 1990
INVENTOR(S) : Manabu Urata, et al.

It is certified that error appears in the above-identified patent and that said Letters Patent is hereby corrected as shown below:

Title page. item (75) should read:
--Manabu Urata, Tokyo, Japan and Hideki Hirao, Tottori, Japan--.

Item
[73]  Please change the Assignee from "Sanyo Electrical Co., Ltd.," to --Sanyo Electric Co., Ltd.,--.

Signed and Sealed this

Fifteenth Day of December, 1992

Attest:

DOUGLAS B. COMER

*Attesting Officer*      Acting Commissioner of Patents and Trademarks